(12) United States Patent
Mantl

(10) Patent No.: US 7,915,148 B2
(45) Date of Patent: Mar. 29, 2011

(54) METHOD OF PRODUCING A TENSIONED LAYER ON A SUBSTRATE

(75) Inventor: Siegfried Mantl, Juelich (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 12/496,676

(22) Filed: Jul. 2, 2009

(65) Prior Publication Data

US 2009/0298301 A1 Dec. 3, 2009

Related U.S. Application Data

(63) Continuation of application No. 10/554,074, filed as application No. PCT/DE2004/000736 on Apr. 8, 2004, now Pat. No. 7,615,471.

(30) Foreign Application Priority Data

Apr. 22, 2003 (DE) .................................. 103 18 283

(51) Int. Cl.
*H01L 21/00* (2006.01)
(52) U.S. Cl. .......... 438/479; 438/311; 438/530; 257/18; 257/347

(58) Field of Classification Search ........................ None
See application file for complete search history.

(56) References Cited

U.S. PATENT DOCUMENTS

| 6,515,335 | B1 * | 2/2003 | Christiansen et al. ........ | 257/347 |
| 6,689,671 | B1 * | 2/2004 | Yu et al. ........................ | 438/486 |
| 6,746,902 | B2 * | 6/2004 | Maa et al. ..................... | 438/149 |
| 6,767,802 | B1 * | 7/2004 | Maa et al. ..................... | 438/406 |
| 6,774,015 | B1 * | 8/2004 | Cohen et al. .................. | 438/479 |

* cited by examiner

*Primary Examiner* — Jarrett J Stark
*Assistant Examiner* — Nicholas Tobergte
(74) *Attorney, Agent, or Firm* — Jonathan Myers; Andrew Wilford

(57) ABSTRACT

A silicon on insulator (SOI) substrate is converted into a strained SOI substrate by first providing an SOI substrate having a thin silicon layer and an insulator and at least one first epitaxial relaxing layer on the SOI-substrate. Then a defect region is produced in a layer by implantation of SI ions above the silicon layer of the SOI-substrate. Finally the first layer is relaxed by a thermal treatment in an inert atmosphere to simultaneously strain the silicon layer of the SOI-substrate via dislocation mediated strain transfer and to produce the strained silicon layer directly on the insulator.

3 Claims, 3 Drawing Sheets

METHOD OF PRODUCING A TENSIONED LAYER ON A SUBSTRATE

CROSS REFERENCE TO RELATED APPLICATIONS

Figure 1:
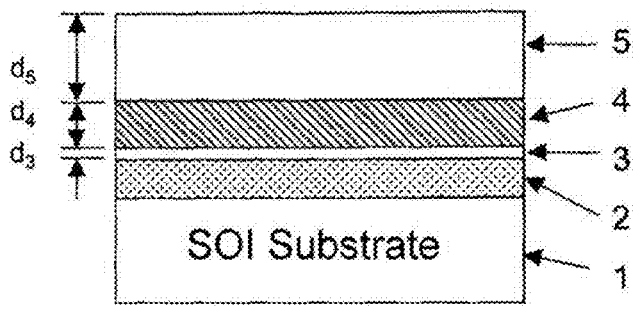

This application is a continuation of copending application 10/554,074 filed 10 Oct. 2005, and now U.S. Pat. No. 7,615,471 issued 10 Nov. 2009, which is the U.S. National Phase of PCT/DE 2004/000376 filed 8 Apr. 2004 and claiming the benefit of the priority of German Patent Application 103 18 283.7 filed 22 Apr. 2003.

FIELD OF THE INVENTION

The invention relates to a method of making a strained layer on a substrate.

BACKGROUND OF THE INVENTION

The rapid advance in nanoelectronics has required increasingly more rapid transistors, especially metal oxide field effect transistors (MOSFETs). A power increase is as a rule obtained with a reduction in the transistor dimensions. This is, however, very expensive and difficult to achieve since the key technologies in chip production, like the lithographic process and the etching process must be replaced by systems capable of greater outputs.

An alternative approach is the use of materials capable of greater outputs. Instead of the usual silicon substrates, increasingly so-called silicon on insulator (SOI) substrates are used. In those cases, beneath a monocrystalline silicon surface a buried silicon oxide ($SiO_2$) layer may be provided with insulating characteristics. Electronic components, especially MOSFETs (metal oxide silicon field effect transistors) have with SOI substrates more rapid switching operations and reduced losses. These substrates are commercially available and are made either by ion implantation of oxygen in silicon and heat treating (the so-called SIMOX process, SIMOX wafer) or by means of bonding of two oxidized wafers and splitting or back etching a part of the second wafer (the so-called Wafer Bond process). The thus made wafer is referred to as a BESOI wafer (bonded and etch back SOI).

It is known also to use strained silicon (strained silicon-germanium alloys (Si—Ge) or silicon-carbon (Si—C) and silicon-germanium-carbon (Si—Ge—C). The use of silicon or Si—Ge, Si—C or Si—Ge—C in certain elastic dislocation states or distorted states, improves the material properties especially with respect to the charge carrier mobility of electrons and holes which are primarily important for electronic components. The use of these and other high value materials enables a performance enhancement of Si based high power electronic components like MOSFETs and MODFETs without the need to reduce the critical structural dimensions of the electronic components. Such elastically strained layer systems enable epitaxial growth on special substrates or on strain-relaxed layers and so-called virtual substrates whose production with reduced defect densities is very expensive and difficult (F. Schaeffler, Semiconductor Sci. Techn. 12 (1997) pages 1515-1549).

The production of monocrystalline layers with substrate materials which are currently available is greatly limited or the quality of the layers grown is reduced. Different crystal structures as well as different lattice parameters between the substrate and the layer material (lattice mismatch) reduce as a rule the ability for monocrystalline growth of layers of the higher quality. When monocrystalline layers are deposited on surfaces or bodies with lattice parameters which are not matched to those of the monocrystalline layer, the monocrystalline layer develops from the beginning in a strained state since its lattice structure differs in this state from that of the substrate. If the deposited layer exceeds a so-called critical layer thickness, the mechanical strain undergoes dislocation formation as it tends toward relief and the lattice structure becomes closer to the original or to that of the substrate. This process is referred to as strain relaxation and in the following as relaxation. At the interface so-called lattice mismatch dislocations (misfit dislocations) can arise and in the relaxed layer are in the form of threading dislocations which run from the surface of the layer to the interface. The misfit dislocations are required for strain relaxation and do not degrade the layers lying thereabove. From a certain lattice mismatch (about >0.5%) the threading dislocation density is so high, however, that such layers maybe unsuitable for electronic components. In general, the threading dislocation density can be somewhat reduced by a temperature treatment. Under the term dislocation density or defect density, the threading dislocation density is to be understood here. Since most of the dislocations either advance through newly grown layers, they may reduce the electrical and optical characteristics of these layers significantly.

Since the silicon-germanium (Si—Ge) material system is thermodynamically a fully miscible system, the compound can be produced in optional concentrations in either silicon or germanium. Silicon and germanium indeed are characterized by the identical crystal structure although they differ with respect to the lattice parameter by about 4%, that is an Si—Ge layer or a pure Ge layer will grow in a strained state on silicon. Carbon can be incorporated into silicon in an amount up to about two atomic % on substitutional lattice sites so as to reduce the lattice parameter.

The state of the art in the production of strained silicon on strain free qualitatively high value silicon-germanium alloy layers on a silicon substrate is the use of the so-called graded layer on which the desired strained layer is deposited in a further step. The graded layer can be a silicon-germanium layer whose germanium concentration increases continuously to the surface until it reaches the desired germanium content continuously or in a stepwise manner. Since, to maintain the layer quality, only an increase in the germanium content of about 10 atomic % per μm is required, such layers depending upon the germanium concentration to be achieved, can be up to 10 micrometer thick. The layer growth of this graded layer is described in (Thin Solid Films, 294 (1997), 3 to 10).

This process gives rise, as a drawback, to excessively high layer roughnesses, to dislocation multiplication and thus to a bundling of threading dislocations which can develop in such manner as to make the electronic components to be made from the layers nonfunctional.

In addition, there can be a tipping or tilting crystallographically of certain regions so that an expensive polishing operation of the layer, for example by means of chemical mechanical polishing techniques is required before strained silicon can be deposited on the thus produced buffer in an additional epitaxial growing step.

Before this second layer deposition in a CVD reactor or in a molecular beam epitaxy apparatus, a special wafer cleaning must also be carried out to insure a monocrystalline growth and to minimize the inclusions of impurities or undesired doping substances. The many process steps, among others, a lengthy deposition process as a consequence of the large layer thicknesses required, expensive polishing, wafer cleaning and two separate epitaxy steps, reduce the output or productivity of the process and limit the quality. The thermal conductivity of such graded layers is so sharply reduced by comparison to silicon that high power electric components rapidly are overheated.

Indeed, from Leitz, et al, Applied Physics Letters, Vol. 79(25) (2001), pages 4246-4248) and Cheng et al (Mat. Res. Soc. Symp., Vol. 686 (2002) A1.5.1-A1.5.6 it is known that a strain relaxed or a strained layer can be transferred to a second wafer with wafer bonding. The disadvantage of this approach is, however, that very many technically difficult steps are required. A strain relaxed layer or also only a single strained surface layer can thus be bonded to an insulating $SiO_2$ layer on the second wafer. Among other things, it is exceptionally problematical to transfer the strained layer by wafer bonding to a second substrate without altering the elastic strain of the layer and in such manner as to avoid the inclusion of impurities. Impurities, for example at the interface of the strained silicon with the $SiO_2$ increase in an undesirable manner the interface state density. Even the smallest impurity level can effect the switching properties of MOSFETs which are formed on the strained silicon in a highly detrimental manner. Precisely with MOSFETs with ultrathin strained silicon the interface state density should be in the range of $10^{10}$ cm$^{-2}$ at the $Si/SiO_2$ interface. Technologically, this can be achieved only with ultrapure interfaces. Whether this wafer bond process can satisfy this requirement has not yet been shown.

From R. Delhouge, P. Meunier-Beillard, M. Caymax, R. Loo, W. Vanderhorst (First Int. SiGe Technology and Device Meeting (ISTDM2003), Jan. 15-17, 2003, Nagoya, Japan, page 115) it is known that thin relaxed Si—Ge layers can be produced by forming in an SiGe layer (for example 170 nanometer Si—Ge with 22 atomic % Ge) a very thin (for example 10 nanometer) Si—C layer with a sufficiently high carbon content. During the heat treatment at elevated temperatures of about 1000° C. carbon precipitates out as a result of supersaturation. In this manner defects are formed which promote the relaxation of an Si—Ge layer.

It is a disadvantage that in this manner no strained layer can be formed on an insulator. The surface roughness makes polishing necessary as a rule. Furthermore, a high temperature is required for the relaxation since the high temperature is made necessary by the precipitation of carbon and thus lower temperatures cannot be used.

From WO1999/038201, a method is known which permits the production of a thin strain-relaxed Si—Ge buffer layer by means of ion implantation and thermal treatment. A drawback of this method is that with it, no strained layer can be directly produced on a substrate. As a consequence, two separate epitaxial deposition and wafer cleaning steps are required.

The object of the invention is thus to provide a simple method of making a strained layer of high quality on a substrate without wafer bonding and/or wafer polishing.

Especially in an advantageous mode, strained silicon should be directly applicable of an SOI wafer over its entire surface or locally and in an optional form. In local application, the planarity between the strained and nonstrained response should be free from any step formation to enable the further processing of electronic components.

It is an object of the invention, further, to provide electronic and/or optoelectronic components which have the above mentioned advantageous layer structures.

The objects of the invention are achieved with a method according to the main claim. The objects are achieved further by a layer structure according to the auxiliary claim. Advantageous modes and features are found in the patent claims which are respectively dependent thereon.

According to the main claim, to produce a strained layer on a substrate, the following steps are carried out:
generating defects in a layer adjoining the layer to be strained,
relaxing at least one of the layers adjoining the strained layer.

For this purpose, the layer structure is subjected to at least one thermal treatment and/or an oxidation so that starting from the defects, dislocations are formed which give rise to a relaxation of one of the layers neighboring the strained layer.

As a consequence, the straining of the layer to be formed as a strained layer is advantageously effected.

Under the term "defect", crystal defects are to be understood, that means atomic and extended defect locations, for example, clusters, bubbles, hollows and the like. Starting from such generated defect regions, dislocations are formed which give rise to a relaxation of a layer neighboring the layer to be formed as the strained layer.

Under "relaxation" an abatement of the elastic strain within a layer is to be understood.

The term "neighboring layer" is to be understood as referring to a layer which may be directly adjacent the layer to form the strained layer or to one or more layers separated therefrom to the extent that the relaxation of dislocations therein gives rise to the strained layer.

The term "substrate" is used in the broadest sense to refer to a layer on which the strained layer can be provided. In the course of the invention, it is possible to provide additional layers on the substrate as well.

On the free surface of the strained layer or the layer to be the strained layer, epitaxially at least one first layer can be applied, whereby this first layer has a different degree of strain than the layer to form the strained layer.

In the first layer, therefore, defects can be generated. The layer structure is subjected to at least one temperature treatment so that starting from the defects, dislocations will be formed which lead to relaxation of the first layer. As a consequence thereof, the layer below which is to be the strained layer is thereby strained.

The defects also can be self generating also in the layer to form the strained layer.

As in the first layer, a graded layer is also to be understood with which, when the graded layer is in the vicinity of the layer to form the strained layer, it has a different degree of strain than the layer to form the strained layer. Thus, in the graded layer a defect region is produced. The layer structure is then subjected to a thermal treatment so that starting from this defect region, dislocations are formed which give rise to a relaxation of the region of the graded layer in the vicinity of the strained layer. As a consequence, the strain will transmit to the bounding layer intended to form the strained layer.

In the course of the method of the invention, the layer intended to form the strained layer is formed into an elastically strained layer. To this end, the layer bounding on the strained layer to be formed relaxes, thereby insuring advantageously a transition of the layer to be strained into the desired strained state. In the case of a graded layer as the first layer, the layer region of the graded layer which bounds upon the strained layer relaxes so that the strained layer is transformed into the desired strained state. The layer disposed upon the layer which is to form the strained layer has a different degree of strain than the layer to form the strained layer itself.

In the course of the method, the deposition of additional layers is possible.

Thus, it is possible to carry out the method with the following steps:

on a layer to form the strained layer on a substrate, at least one first layer of a different lattice structure is deposited and a second layer deposited on the first layer, whereby the first layer has a different degree of strain than the layer to form the strained layer, in the second layer and/or in a further layer a defect region is produced, the layer structure is subjected to a thermal treatment so that starting from the defect region dislocations are formed which contribute to relaxation of the first layer.

The first relaxing layer borders upon the layer which is intended to form the strained layer and as a consequence, causes that layer to be a strained layer.

When different lattice structures for the layers are described, it is meant that they have a difference in the respective lattice parameters and/or in the crystal structure.

According to the invention, between a layer adapted to form the strained layer and the substrate, a further layer which is also relaxed in the course of the process can also be arranged. In that case, one obtains a relaxed layer on a substrate upon which a layer to form the strained layer is arranged. On the latter, in the further course of the method, a relaxing layer is applied. Upon this relaxing layer can a layer adapted to form a strained layer, be applied. Further layers can then be applied thereto. The relaxing layers have a different degree of strain than the neighboring layers which are to form the strained layer. After relaxation of the layers, the layer adapted to form the strained layer is strained in a method step during the thermal treatment or during the oxidation.

The defect region can also be produced in the substrate. The defect region is so produced that the dislocations give rise to a relaxation of a neighboring layer to the layer adapted to form the strained layer.

Such an epitaxial layer structure or wafer can advantageously be made in a deposition process. It is especially advantageous when the wafer is introduced into the reactor and can be coated without expensive polishing and cleaning operations.

By the choice of the strain of the layer to be applied to the layer adapted to form the strained layer, namely, whether that strain is a tension strain or a compression strain, the resulting strain is selected for the layer adapted to form the strained layer.

So that the relaxation of a strained layer and thus a strain can be applied to the layer to be strained, the layer structure is advantageously subjected to a thermal treatment. It is, however, also conceivable in place of a temperature treatment to use another treatment so that a neighboring layer will be relaxed and the layer is strained.

It is especially advantageous to carry out the relaxation by means of an oxidation with $O_2$ or water vapor [steam]. Instead of a purely thermal treatment to form the relaxed region, an oxidation treatment can be carried out thereafter or, also a combination of oxidation and thermal treatment can be used. In this case, the concentrations of the elements are important for the functionality of the electronic component, can be increased within the layer structure (for example, there can be a Ge enrichment of the Si—Ge).

The substrate is preferably an SOI substrate whose silicon surface is to be strained.

As to the substrate generally, an amorphous layer, of especially an insulator, can also be used. The substrate can, however, equally well be a material with optional electrical characteristics which permits a thermally induced straining of the layer to form the strained layer with the aid of the method according to the invention. In this sense, a crystalline hetero interface with a sufficiently large lattice mismatch (for example 1%) or with different crystal structures is suitable when the layer thickness $d_3$ of the layer to form the strained layer is selected to be sufficiently small (for example 5 to 50 nm) and the substrate sufficiently thick, for example 10 to 100 times the thickness of the to be strained layer. These conditions are fulfilled for example by a monocrystalline SOI substrate, silicon on sapphire.

Also suitable are substrate materials which at the temperatures required for relaxation, become Viscous. For example, silicon dioxide ($SiO_2$) become viscoelastic at temperatures of about 950° C. By means of boron doping SiO can be made viscoelastic already at about 800° C.

In this sense, other temperature resistant glasses are also suitable. Such substrates can be made by wafer bonding, in a manner similar to that for commercial BESOI substrates whereby a thin Si layer is bonded to silicon dioxide. The putative strained layer that is the layer to be transformed into the strained layer, can thus in principle be applied to a suitable optional glass or another appropriate temperature resistant substrate. With corresponding thicknesses of these materials, they can also fulfill the functions of a suitable mechanical support for the layer structure. A certain bendability of the substrate is also desired in conjunction with the development of "flexible electronics".

As materials for the substrate, especially for example Si—C, graphite, diamond, quartz glass, Gd Ga garnet as well as III-V semiconductors III-V nitrides fall within the considerations.

The process according to the invention has a number of advantages.

Advantageously, this process enables the production of a strained layer only through an epitaxial deposition and without expensive and time consuming process steps like wafer bonding and polishing (CMP).

It is also an advantage that commercially available SOI structures, BESOI wafers or SIMOX wafers with a thin silicon surface adapted to form the strained layer can be used as the base. The silicon layer of this wafer is then strained during the process. SIMOX wafers have generally a dislocation density of about $10^{-5}$ cm$^{-2}$, more usually $10^2$-$10^3$ cm$^{-2}$ but show good layer homogeneity and purity as well as economical fabrication.

The method utilizes process steps which have become established in silicon technology. The technology can also be transferred to very large wafers, for example 300 mm wafers.

The defect region can be produced by ion implantation.

In a further development of the invention it is also possible to produce the defect region already with the application of the layers to the putatively strained layer, for example by reducing the temperature, for instance to about 200° C., in a molecular beam epitaxy apparatus during the deposition of the layer or of a graded layer upon the layer to form the strained layer.

In a further advantageous feature of the invention, the defect region can be produced by incorporating an Si—C layer.

In a further features of the invention, for the thermal treatment, as a suitable parameter, a temperature is selected which lies between 550° C. and 1200° C. and especially between 700° C. and 950° C. In this case, starting from a defect region in the first and/or second layer, defects and especially dislocations which can give rise to a relaxation of the first layer are formed as a result of which the putative strained layer can be strained.

By the choice of the straining of the first layer, tension strains or compression strains can be selected and the resulting strain in the putative strained layer can be selected. If the first layer prior to the temperature treatment is under compressive strain, for example, by the selection of Si—Ge as the material for the first layer (with an optional Ge concentration,) then the layer which is to be provided with the strain, for example, comprised of silicon, will have a tensile strain transferred thereto.

Conversely, compression-strained silicon can be produced for example by the use of a first layer under tensile strain and, for example, of Si—C with up to about 1 to 2 atomic % C. The use of ternary alloys like Si—Ge—C and the use of doped Si layers or alloys (B, As, P, Sb, Er, S or others) is also possible.

The thermal treatment can be carried in an inert atmosphere, vacuum or also in an oxidizing environment, for example, in $O_2$ or $H_2O$, or in a nitriding atmosphere, for example, in $NH_3$, or a reducing atmosphere, for example, in forming gas. Very good results are obtained with thermal treatment in nitrogen.

The so produced strained layer can be exposed, for example, by wet chemical removal of the second layer and then at least partially of the first layer. This layer structure serves to allow complex layer structures to be built up. For this purpose, the skilled worker in the art can use all available processing techniques and layering materials depending upon the layer structure to be formed and the particular requirements the layer structure is to satisfy.

As starting structures, as has been noted, basically SOI structures, SIMOX wafers or BESOI structures can be used. In these cases, the layer to be formed into the strained layer, the insulator and the substrate will already be available as the basic structure.

It is, however, possible to apply the layer to form the strained layer initially to an amorphous layer, for example, an insulator forming the amorphous layer and then generate the strain. The insulator can be disposed on a substrate, for example, of silicon or can form the substrate itself. The layer to be strained can advantageously be silicon. The layer to be strained can especially advantageously be formed with a thickness of 1 to 100 nm, especially of 5 to 30 nm. This layer thickness $d_3$ should at least not exceed the critical layer thickness and must be so small that at least a substantial part of the dislocations from the first layer can spread along the glide planes in this layer. This technique depends especially upon the degree of strain in the first layer and its layer thickness $d_4$. The larger the desired strain of the layer the smaller must $d_3$ be. A large layer thickness ratio of $d_4/d_3$ appears to be advantageous, especially a layer thickness ratio of $d_4/d_3$ of greater than 10.

In an especially advantageous feature of the invention as the first layer upon the layer to form the strained layer should be for example an epitaxial Si—Ge or Si—Ge—C or Si—C layer with a thickness close to the critical thickness. The critical layer thickness defines the maximum layer thickness for this first layer at which a defect free growth is still possible on the nonlattice matched layer to ultimately from the strained layer. At a layer thickness below this critical layer thickness as a rule strongly pseudomorphic that is completely defect free growth will be produced. The critical layer thickness should not be exceeded to the extent that the layer will already be noticeably relaxed.

As an alternative to a layer with constant composition, the graded layer can be used. The composition can rise or fall within the graded layer. In the case of Si—Ge, the concentration can slowly rise or rise in steps or it can commence with an higher germanium concentration or even with pure germanium (Ge) over only several nanometers. If in spite of this a sufficient layer thickness $d_4$ must be maintained without exceeding the critical layer thickness, the Ge concentration can rapidly drop (for example to 25 atomic %). Under this selected condition, the layer thickness can lie at about 80 nanometers. The region with the higher Ge concentration enables high degrees of relaxation in excess of 80%.

A U-concentration profile can also be of advantage to produce a certain Ge concentration of, for example, 20 to 40 atomic % and the greatest possible degree of relaxation of the first layer and thus a high degree of strain in the layer to which the strain is to be transferred.

It is thus advantageous to select a thickness $d_4$ of the first layer which is as large as possible consistent with efficient strain relaxation.

With a constant Ge concentration of 20 atomic % Ge a maximum thickness of about 400 nanometers can be produced. A complex concentration profile is of advantage with higher Ge contents.

In a further feature of the invention, the second epitaxially deposited layer can be made from epitaxial silicon. This layer then serves to form a defect region. The layer thickness $d_5$ of this layer can be optimized for the formation of the defect region. It is not limited by growth criteria. The thickness $d_5$ can thus be freely varied (for example from 0 to 1000 nanometers). Advantageously, a thickness of about 200 to 500 nanometers is used with hydrogen and helium implantation. The thinnest possible layer enables implantation with low energies (for example 10 keV) and thus with a sharper distribution of the implanted ions as is advantageous for the formation of a thin defect region with a constant cost saving.

Optionally, a further layer is also deposited, for example, to avoid surface roughening by blistering after hydrogen or helium implantation upon the second layer. This further layer can be amorphous or a polycrystalline layer. This further layer can be deposited before or after the generation of the defect region, for example, by ion implantation. The layer thickness of this optional layer need be determined only by the implantation parameters.

The materials and techniques of the individual layers given here are given by way of example only and should not be understood to be a limitation of the invention.

In an especially advantageous feature of the invention by arranging a mask on the second or optional further layer, a locally limited defect region is produced. It is especially advantageous in this connection that the layer which is to become the strained layer should have planar regions which may be locally strained and unstrained, that is regions which are strained and unstrained in a plane directly adjacent one another without step formation between them as has been the case with the techniques known in the art.

The defect region or regions can be made especially advantageous by ion implantation using light ions like hydrogen ($H^+$, $H_2^+$), helium, fluorine, boron, carbon, nitrogen, sulfur, and so forth, or using ions of the layer material or the substrate materials themselves, and thus for example silicon or germanium in an Si/Si—Ge-heterostructure in such manner that the ions are primarily implanted in the second layer.

It is advantageous to use ions which avoid undesired contamination or doping of the structure. In this case, inert gas ions, for example, Ne, Ar, Kr, etc. are usable.

For hydrogen or helium ions a dose of about $3 \times 10^{15}$ to $3.5 \times 10^{16}$ cm$^{-2}$ and especially for helium of $0.4 \times 10^{16}$ to $2.5 \times 10^{16}$ cm$^{-2}$ is used. A combination of two implants, for example the first being hydrogen and the second being helium or the first being boron and the second being hydrogen, can be suitable. A boron implantation in combination with hydrogen implantation permits the hydrogen implantation dose to be reduced. In addition, a thermal treatment between the implantation steps can be advantageous to produce nucleation seeds for the defect formation.

The defect region is advantageously formed at a distance of 50 to 500 nm from the layer to be relaxed.

In the case of hydrogen or helium ions, the energy of the ions and the main range of the ions is so selected that they are implanted at a distance $d_6$ from the interface of the first and second layers. This distance $d_6$ lies, for example, in the range of 50 to 300 nm. For heavier ions and/or larger layer thicknesses of the second layer, these limits can also be exceeded.

If there is only one layer with a constant concentration (or a graded layer) applied to the layer to form the strained layer, it is possible for the artisan with few and simple tests to so arrange the defect region that after the thermal treatment the first layer will be relaxed and the layer to be strained will have the requisite strain.

The implantation depth is matched to the layer thickness of the second layer and, where appropriate, also to further optional layers and to the mass of the selected ions.

In an especially advantageous further feature of the invention, the maximum damage will lie within the second layer, especially at a distance $d_6$ from the first layer and not in the first layer itself. This applies especially for ions which give rise to bubble formation or crack formation like, for example, helium, fluorine, neon, argon and so forth.

Advantageously with an Si implantation be comparison to implantation with very light ions like for example hydrogen ions or helium ions, the dose can be significantly reduced, that is by a factor of 10 to 100. This shortens advantageously the implantation duration and increases the wafer output significantly. With the goal of achieving a higher degree of relaxation, it is possible, however, also to carry out defect formation by means of two or more implantations in the first layer and in the second layer independently from one another. An advantageous mode of operation is also to carry out first one or more implantations with different energies, possibly also with different ions in the first layer at reduced doses and to create the defect regions in the second layer with a second implantation. The production of point defects in the first layer to be relaxed gives rise to accelerated diffusion and to more relaxation.

The ion implantation can be carried out over the entire area of the substrate or, by the use of an implantation mask, for example a photo lacquer, at optionally selected location on the wafer.

In a further feature of the invention, the wafer is not tilted at an angle of 7° for the ion implantation as is known from the state of the art. Rather, the wafer is tilted at an angle greater than 7° from the normal, especially to an angle of 30° to 60°.

This makes it possible to produce strained and nonstrained layers one after the other upon the wafer while insuring planarity. This is possible since the subsequent thermal treatment can be carried out with a thermal budget which is so small that nonimplanted regions of the first layer are not relaxed or are scarcely relaxed and so that the layer to form the strained layer is also not changed at these locations.

It is especially advantageous to match the implantation mask to the layout of the electronic component or its insulation regions. Only the regions where for example strained silicon is required for the components are implanted.

Advantageously, the first layer is scarcely damaged or not damaged at all by the implantation which is thus carried out. The optimal dose and energy and ion type does not depend upon the composition and layer thickness of the first layer to be relaxed and thus can be simply optimized when the implantation takes place in the second layer.

After removal of the first layer and optionally the second layer and further optional layers, one obtains the desired strained layer or unstrained regions of this layer at the non-implanted locations with the same layer thickness, thereby maintaining planarity throughout. Advantageously, the first layer applied thereon at least in the last part of the removal phase is selectively removed by a wet chemical process.

The transition regions between strained and unstrained portions are advantageously configured as insulation regions between the electronic components.

It is especially advantageous when silicon dioxide is selected as the insulation material. In a further feature of the invention instead of an exclusive first layer, i.e. only the first layer on the layer to form the strained layer, a layer system of multiple layers is used.

Upon the strained regions which are produced, further epitaxial layers can be deposited in order, for example, to increase the layer thickness of the strained region or to match the thickness locally of the wafer or to apply new layers, for example, in order to realize more complex electronic or optoelectronic components.

With the method according to the invention, a strained layer can be produced it advantageously has an extremely small surface roughness, usually of less than 1 nm and only a limited defect density of less than $10^7$ cm$^{-2}$, especially less than $10^5$ cm$^2$.

The limited roughness is especially advantageous for the production of MOSFETs in which a thermal oxide or another dielectric, for example, a high-k dielectric, that is a material with high dielectric constant, must be produced on the strained layer. The surface roughness has an exceptionally sensitive effect on the electrical quality of the dielectric which is the heart of a transistor. The mobility of the charge carries also is determined to a significant extent by the nature of the interface in a very thin layer. The surface roughness of for example strained silicon can be reduced by the growth of a thermal oxide thereon even further. This thus produced oxide can be removed prior to the growth or deposition of the gate dielectric on the strained layer.

The method in a further and especially advantageous feature of the invention offers the potential for a further reduction in the dislocation density in the relaxed and the strained layers.

This can be achieved by the etching of trenches in the coating with a spacing of the order of micrometers, for example, 1 to 100 micrometer or advantageously, by trench etching, matching the electric component structures and subsequent heat treatment at temperatures above 500° C. Threading dislocations in the layer slip to the edge of this region and are thereby healed. These etched trenches can however also be used to produce so-called shallow trench insulation. For this purpose, the trench is filled with insulator material and so separates electronic components from one another electrically.

A further suitable method of reducing the defect density is the application of a counter or oppositely strained layer upon the relaxed first layer after that layer has been partially relaxed by implantation and thermal treatment. For the further relaxation of for example an Si—Ge layer a compression strained layer, for example, a silicon nitride layer (for example 100 nm) is deposited in a PE-CVD reactor. A subsequent thermal treatment, for example, by tempering or heat treating in an inert or reactive atmosphere, produces a higher level of relaxation of the Si—Ge layer and thus a greater level of tension of the Si layer which is to be dimensioned. Simultaneously the dislocation density is reduced. This method can also be applied to previously structured surfaces.

The production of a system on a chip, that is various electronic components with different functions in a single plane is thus advantageously possible within the scope of the invention. As has already been indicated, with the invention strained and nonstrained portions of a layer can be made while insuring the planarity thereof. This enables the production of special electronic components/circuit elements with strained or nonstrained regions of for example silicon. These especially very thin layers can be locally reinforced or amplified by further deposition, for example, also be selective deposition, in order to fabricate for example contacts for the source and drain, so-called raised source and drain source to make power components.

The second layer also, for example, a strained Si—Ge layer, can be used in the nonimplanted regions for the production of special components for example especially advantageously for p-MOSFETs, since these layers depend upon the germanium content and can have especially high hole mobilities which are 2 to 3 times greater than those of silicon.

For the production of, for example, p and n channel MOSFETs, the thus made strained Si layers are advantageously used since the electron mobility and the hole mobility in the tetragonal lattice of the strained silicon is higher by about 100% and to about 30% than that of the unstrained silicon when the lattice strain is greater than 1%. Thus one is not bound to particular transistor types or components. MODFETs, resonant tunnel diodes, photodetectors and quantum cascade lasers can be realized.

In the following, the invention is described in greater detail in connection with examples or embodiments and the accompanying figures. They show:

FIG. 1: a schematically illustrated layer system comprising an SOI substrate 1, 2, 3 and a first epitaxially applied layer 4 and a second epitaxially applied layer 5.

Figure 2:
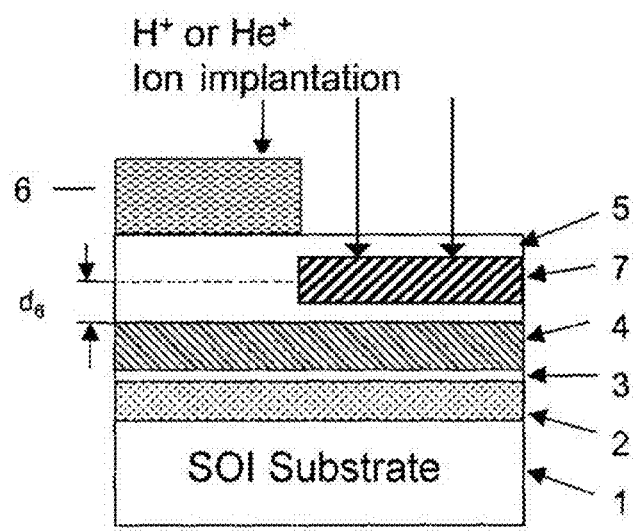

FIG. 2: a schematically illustrated layer system comprising an SOI substrate 1, 2, 3 and a epitaxially applied layer structure with an implantation mask 6 and a defect region 7 in the second layer 5.

Figure 3:
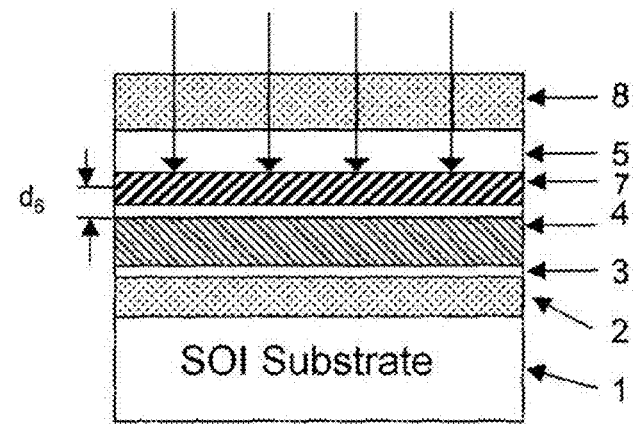

FIG. 3: a schematically illustrated layer system comprising an SOI substrate 1, 2, 3 and an epitaxially applied layer structure comprising a further optional protective layer 8.

Figure 4:
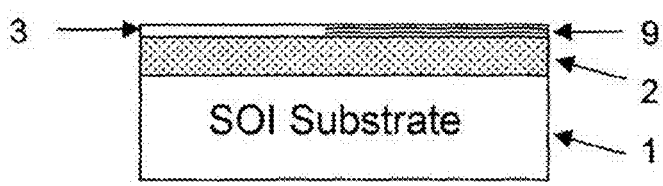

FIG. 4: a schematically illustrated layer system comprising an SOI substrate 1, 2, 3 with a strained region 9 adjacent a nonstrained region 3 on an insulator layer 2.

Figure 5:
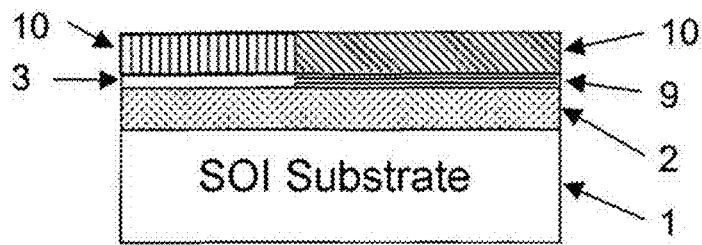

FIG. 5: a schematically illustrated layer system with an additional epitaxial layer 10 which is epitaxially applied to the strained and nonstrained regions 9 and 3.

Figure 6:
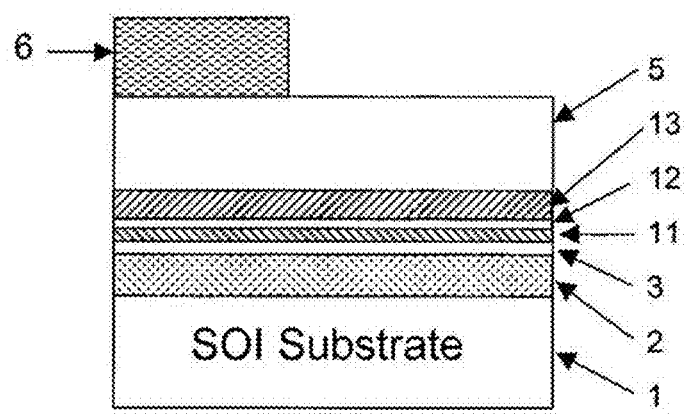

FIG. 6: an alternative schematically illustrated layer structure with three layers 11, 12, 13 applied to the layer 3 to be strained, layer 11 serving as an additional buried layer to be strained or as an etch-stop layer.

Figure 7:
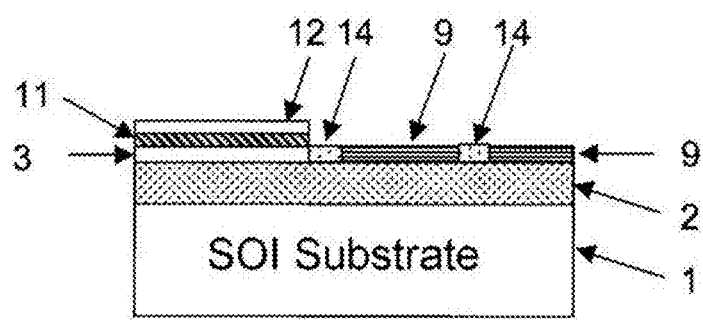

FIG. 7: a schematically illustrated layer system with an insulation region 14 (shallow trench insulation) between strained region 9 and unstrained region 3.

Figure 8:
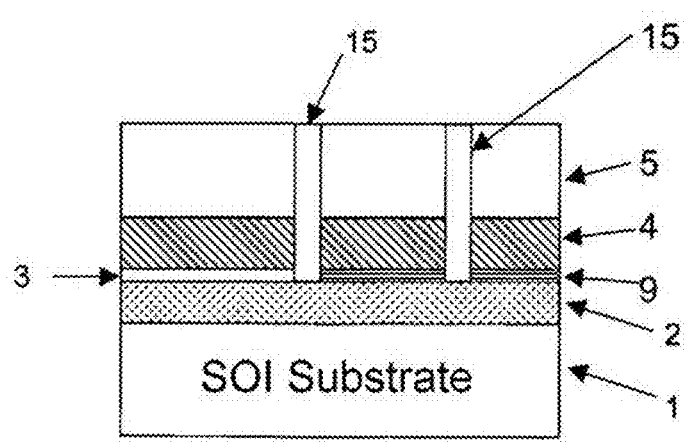

FIG. 8: a schematically illustrated layer system as in FIG. 1 with etched trenches 15.

Figure 9:
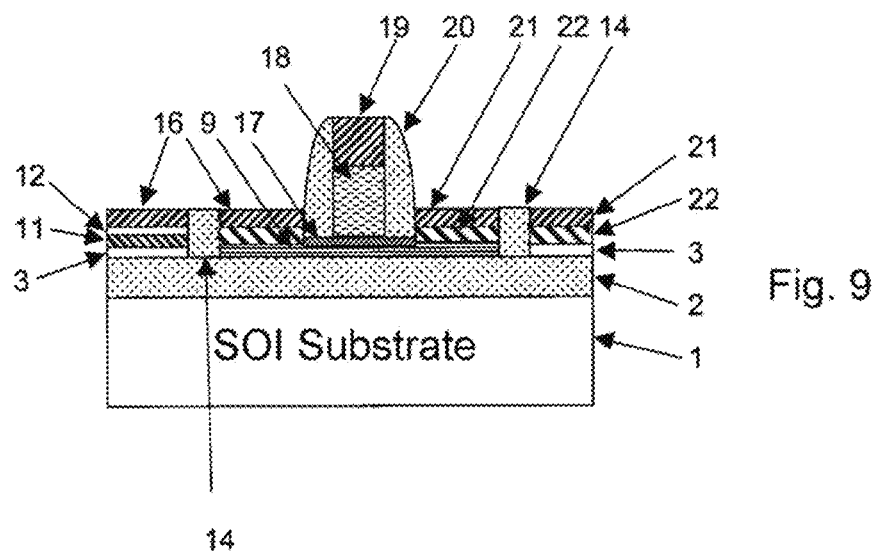

FIG. 9: a schematic illustration of a MOSFET on a strained Si layer with a gate stack and raised source and drain and a silicide contact on an insulator. To the right of the transistor an unstrained silicon layer 3 can be seen and to the left a strained Si—Ge layer 11 on an unstrained Si layer 3.

FIRST EMBODIMENT OR EXAMPLE

Production of a strained Si layer on $SiO_2$ with helium ion or hydrogen implantation and heat treating.

As illustrated in FIG. 1, a first epitaxial Si—Ge layer 4 with 22 atomic % and a layer thickness $d_4$ of 220 nm is deposited in a defect free or close to defect free state by gas phase epitaxy or molecular beam epitaxy on a silicon surface layer 3 of a thickness $d_3$ of 20 nm on an SOI substrate 1, 2, 3 (SIMOX or BESOI). Then as the second layer 5 monocrystalline silicon is applied with a thickness $d_5$ of 500 nm.

The layer structure 1, 2, 3, 4, 5, after application of a mask 6 (FIG. 2) is implanted with helium ions with an energy of 20 keV and a dose of $1.5 \times 10^{16}$ $cm^{-1}$ and then subsequently heat treated at 850° C. for 10 min. Alternatively, the structure can also be implanted with hydrogen ions with a dose of $2 \times 10^{16} \times cm^{-2}$. Through the implantation a defect region 7 is formed in layer 5 close to the interface ($d_6$ amounted to about 200 nm) with the Si—Ge layer 4, which contributed to the relaxation of the Si—Ge layer in this region during the heat treatment whereas the strain state of the nonimplanted regions was not altered or not significantly altered. The degree of relaxation in the Si—Ge layer amounted to about 75% after the heat treatment or tempering.

Optionally, layer 8 of silicon dioxide with a thickness of, for example, 500 nm can be deposited before or after the implantation. For this purpose, it is advantageous to avoid the formation of blisters on the surface by the hydrogen or helium bubble formation during the thermal treatment (FIG. 3).

In order to increase the degree of relaxation, starting from the layer structure of FIG. 3, the layer 5 or the layer 8 is removed and a silicon nitride ($SiN_x$) layer which is under compressive strain with the thickness of about 100 nm, is deposited on the partially relaxed Si—Ge layer 4 (not shown). This $SiN_x$ layer can be deposited by means of PE-CVD (plasma enhanced chemical vapor deposition). A second thermal treatment of the layer structure at 900° C. for 10 min increases the degree of relaxation at the implanted location to in excess of 80% and the Si layer 9 is again strained.

The further etching of the layer 4 frees the Si layer 3 (FIG. 4) and can be used for the production of high speed electronic components. Below the implanted region, the layer 9 is strained. The threading dislocation density is smaller than $10^7$ $cm^{-2}$.

To match the layer thickness to the requirements for the electronic components, a layer 10 (FIG. 5), for example, of silicon, which has a thickness which does not exceed the critical layer thickness, is epitaxially deposited. It must be observed in this connection that the strain state changes along the layer 10 as has been indicated by the different hatching of the layer 10. This is dependent upon the underlying layers. On strained silicon 9, the silicon 10 grows in a strained state to the critical layer thickness. Instead of a silicon layer any other layer or layer sequence can be deposited.

SECOND EMBODIMENT OR EXAMPLE

Production of a Strained Si Layer on $SiO_2$ with High Strain

The layer formation is carried out in the first example according to FIG. 1.

Instead of a constant composition of the first layer 4, on the layer 3 to be strained of an SOI substrate 1, 2, 3 (or one having a carbon content in an Si—C layer), a graded layer 4 with a strongly nonhomogeneous concentration gradient is deposited. Only optionally is the second layer 5 applied.

It is advantageous for the growth of the layer 4 to begin with a higher Ge concentration (for example 40 atomic % Ge) and possibly even with pure germanium to a thickness of several nm, and then to reduce the concentration during the growth to, for example, 20 atomic % so that a layer thickness of 150 nm can be achieved without the formation of dislocations in a detrimental density during the growth. Optionally the Ge concentration can gradually be lowered continuously or in steps in principle to zero, is lowered over the substantially large layer thickness so that no second layer 5 need be deposited. For a symmetrical strain buildup in the layer 4, a U-shaped concentration pattern can also be used, that is first there can be a drop-off and then a rise in the germanium content in the growth direction. A layer with nonhomogeneous concentration leads to higher relaxation rates and small defect densities then equivalent homogeneous layers. The layer thickness $d_4$ should be as large as possible but however in all cases should lie below the critical layer thickness so that during the growth no noticeable relaxation occurs.

THIRD EMBODIMENT OR EXAMPLE

Si Implantation Instead of Implantation with Light Ions

As an alternative to implantation or light ions, an Si implantation can be effected for example with an energy of 150 keV and a dose of about $1\times10^{14}$ cm$^{-2}$ in a 500 nm thick Si layer 5 (FIG. 2). The implanted Si ions generate crystal defects in the second layer 5 and in the Si—Ge layer 4 which upon relaxation and thus straining of an Si layer 3, renders an SOI substrate 1, 2, 3 suitable.

Then the system is subjected to a thermal treatment for several minutes at 900° C. in an inert nitrogen atmosphere or in vacuum. The implantation energy and dose are optimized by measuring the degree of relaxation and the defect density. Optionally two or more implantations can be carried out with other ions as well in order to produce defect regions in the layer 5 and point defects in the layer 4 to be relaxed. Another inert gas, for example, argon or a gas which is suitable for the purposes of the invention during thermal treatment, for example, $O_2$ or former gas can be used.

FOURTH EXAMPLE OR EMBODIMENT

Production of Two or More Strained Layers in a Layer Structure on an SOI Substrate 1, 2, 3 (FIG. 6)

On an SOI substrate 1, 2, 3 with a 10 nm thick Si surface layer 3, the following layer system is epitaxially deposited: a 25 nm Si—Ge layer 11 with 22 atomic % Ge, a 10 nm thick Si layer 12, an 150 nm thick Si—Ge layer 13 with 22 atomic % Ge (germanium), a 400 nm thick Si layer 5 (FIG. 6).

Optionally several thin silicon layers can be disposed in the Si—Ge.

Then optionally an implantation mask, for example, a photo resist 6 is applied and lithographically structured so that the following ion implantation is carried out only in the noncovered regions. In this case, the layer is implanted with hydrogen ($3\times10^{16}$ cm$^{-2}$) or helium ions ($2\times10^{16}$ cm$^{-2}$) to create a defect region approximately in the center of the 400 nm thick Si layer 5 (not shown). The thermal treatment was effected at 825° C. in nitrogen.

In the region not masked by mask 6, after implantation and thermal treatment, the following layer structure is obtained. Beneath the silicon layer 5, there is a relaxed region of the layer 13 on the strained region of the layer 12. This region of the layer 12 is in turn disposed on a relaxed region of the layer 11 and this in turn is deposited on a strained region of the layer 3 (FIG. 6). Layer 3 represents the surface of the SOI substrate.

After removal of the silicon layer 5 and the Si—Ge layer 13, one obtains on the implanted region a strained silicon layer 12 (10 nm thick) on a relaxed Si—Ge layer 11, here 25 nm thick (no longer shown in the right hand portion of the illustration since it has been removed by etching) and a second strained Si layer 9 on the SiO$^2$ layer 2 of the SOI substrate 1, 2, 3 (see FIGS. 6 and 7).

In the nonimplanted regions below the mask, the strain state of the layers 3, 11 and 12 are not altered or are not significantly altered. Layer 3 and layer 12 have as previously, a cubic silicon structure and the Si—Ge layer is tetragonally strained (FIG. 7). This layer structure can be used as is for producing electronic components or can have further layers deposited thereon. Each of the layers can have in a single plane of the layer mentioned, without step formation, a strained region and an unstrained region of the same layer material.

Alternatively, the 10 nm thick Si layer 12 can also serve as an etch-stop layer so as to reduce the surface roughness after the etching to less than 1 nm. This is especially important for the strained layer 9 on the SiO$_2$ layer 2 since on this strained layer, the gate dielectric for a MOSFET is applied or is thermally generated. Purity and interfacial characteristics determine decisively the quality of the dielectric.

Insulation regions 14 (shallow trench) can be produced in the strained region 9 by etching and filling with insulation material.

FIFTH EXAMPLE OR EMBODIMENT

Reduction of the Defect Density by Etch Trenching 15 and Thermal Treatment and Production of Insulating Regions 14

Analogously to the preceding examples or embodiments, one or two or more strained layers are produced. In these layer structures, etched trenches 15 (FIG. 8 and FIG. 7 before the production of the shallow trench 14) are made. These trenches 15 are as a rule etched up to the insulator layer 2 so that simple insulation regions (shallow trench insulation) can be produced between the components by filling the trenches with an insulator 14 (as in FIG. 7). After the etching a thermal treatment is carried out at a temperature above 450° C., advantageously above 650° C. This thermal treatment has the effect that threading dislocations in layer 4, an Si—Ge layer, and in the strained layer 9 run to the trenches 15 and are thus healed. It can be advantageous to remove the second layer 5 prior to the etching of trenches 15 so that the healing of the dislocations is not hindered by the layer 5. Furthermore, the thermal treatment can also be effected later during fabrication of the electric components and thus simultaneously can serve to heal defects following ion implantation or developing upon growth of the gate dielectric.

SIXTH EXAMPLE OR EMBODIMENT

Strained Silicon on SiO$_2$ Substantially in a Common Plane with Strained Si—Ge Layer and the Fabrication of n- and p-MOSFET Components A layer structure corresponding to that of FIG. 6 is used to first produce the strained layers. After the removal of layer 5 and the Si—Ge layer 13, the layers 12 and 11 can be selectively removed, for example, at the implanted region by wet chemical treatment. The result is a strained silicon surface layer 9 (FIG. 7) adjacent an unstrained Si layer 3 on a thin strained Si—Ge layer 11 shown at the left hand part of the figure (nonimplanted region of the layer 11) approximately in a single plane. The step height between these regions is determined only by the thickness of the layers 11 and 12 (a total of the 35 nm). This step height is smaller than the depth of field of the lithographic process so that further lithographic steps can be carried out without difficulty. The regions can be electrically and structurally separated from one another by insulation regions 14 (FIG. 7).

The result is an optimal structure for a MOSFET device. On the regions with strained silicon 9, ultrafast n- and p-channel MOSFETs can be produced since the electron and hole mobilities in the tetragonal lattice of the strained silicon is increased by about 100% or about 30%, respectively, by comparison to unstrained silicon when the lattice strain is greater than 1% (>1%). On the strained Si—Ge layer 11 of FIG. 7 or on the silicon layer 12, p-channel MOSFETs can advantageously be made since the Si—Ge layer is particularly suitable because of the greatly enhanced hole mobility and small overall thickness of the layers 3, 11 and 12 of about 45 nm (FIG. 7) allows the production of fully depleted MOSFETs.

The thin Si layer 12 can be used advantageously for producing the gate dielectric since a high quality thermal oxide or oxynitride can be formed thereon as the gate dielectric. Advantageously, it is also possible to produce the gate dielectric simultaneously on the various regions thermally or by deposition.

Furthermore, on the nonimplanted regions after selective removal of the Si—Ge layer 11, conventional Si based electric components can be realized. The thin Si layer 12 of FIG. 7 can be used as a template for a further, preferably selective, epitaxy of silicon. In that manner, optimal conditions for achieving very different electronic components on a chip can be provided (system on a chip).

SEVENTH EXAMPLE OR EMBODIMENT

Strained Silicon on $SiO_2$ with the Aid of an Si—Ge/Si—C/Si—Ge Layer Sequence on an SOI Structure On a SOI substrate with a thin Si surface layer with a thickness of 5 nm (or 15 nm) at least three epitaxial layers are deposited comprised of a first 80 nm thick Si—Ge layer (20 at % Ge), a second 10 nm thick Si—C layer with 0.75% C and a further 80 nm thick Si—Ge layer (20 at % Ge). By analogy to FIG. 3, a defect region is produced in the intermediate layer of Si—C while the subsequent thermal treatment at 1000° C. is provided for relaxation of the overlying and underlying Si—Ge layers. The carbon is incorporated in the thin Si—C layer in sufficient concentration. With the thermal treatment at 1000° C., a defect region is formed in the Si—C layer which facilitates the relaxation of the overlying and underlying Si—Ge layers. The Si—Ge layers relax to 90%. Correspondingly, the thin Si layer of the SOI substrate is elastically strained and a strained Si layer on $SiO_2$ is produced.

EIGHTH EXAMPLE OR EMBODIMENT

In the place of a first layer, a layer system is used which is comprised of a thin layer, a compositionally different layer 11 (for example an Si—C or Si—Ge layer with a different concentration) and a further silicon layer 12 and a layer 13 (SiC or Si—Ge) (FIG. 6). For the overall layer thickness these three layers satisfy the same criteria as the first layer 4. Layer 12 can either be transformed to a strained layer or used simply as an etch stop layer. The use of an additional etch stop layer can limit surface roughening during the back etching practically completely since then in the last etching step only a very small layer thickness (layer 11) must be removed before layer 3 or layer 9 is exposed. Layers 4, 11 and 13 can have optional concentration profiles to minimize the defect/density through relaxation.

The method offers in a further and especially advantageous configuration of the invention, the potential for a further reduction in the defect density in the relaxed and strained layer. This can be achieved by the etching of trenches 15 in the layers 5, 4 and 3 (layer 5 can previously have been removed) with spacings in the micrometer (1 to 100 µm) range or advantageously by trench etching which is matched to the electronic component structures (FIG. 10), and subsequent heat treatment at temperatures above 450° C., especially above 650° C.

A further suitable method for reducing the dislocation density is the application of a strained layer on layer 4, following which this is relaxed in large part by implantation and thermal treatment. For further relaxation of an Si—Ge layer, a compression strained layer, for example, a silicon nitride layer (for example 100 nm) can be deposited thereon in a PE-CVD reactor. A subsequent thermal treatment (tempering in an inert or reactive atmosphere) produces a higher relaxation of the Si—Ge layer and thus an increased strain of the Si layer. Simultaneously the dislocation density is reduced. This method can also be used on a previously structured surface (FIG. 7).

FIG. 9 shows a MOSFET with silicide contact 16 (for example a source contact), the gate dielectric 17, the gate contact 18 of, for example, poly-Si or metal, the gate contact 19, for example of silicide, the spacer insulation 20, the silicided drain contact 21 and the raised drain contact 22 (highly doped Si or Si—Ge).

REFERENCE CHARACTER LIST

1. Silicon.
2. $SiO_2$.
3. Layer to be strained with a layer thickness $d_3$.
4. Epitaxial layer, optionally with a concentration gradient (graded), with a layer thickness $d_4$, which is relaxed during the process.
5. Epitaxial layer 5 (for example silicon) with layer thickness $d_5$.
6. Mask.
7. Defect region that for example is produced by ion implantation. The maximum of the range of the ions is at a distance $d_6$ from the interface of the layers 4 and 5. In the case of hydrogen ions and helium ions, platelets, bubbles or microcracks arise in at this depth which form the defects, like dislocations.
8. Protective layer, for example $SiO_2$.
9. Strained layer or region, for example strained silicon.
10. Epitaxial layer which is deposited on the nonstrained layer 3 or the strained layer 9 for example of silicon or Si—Ge—C or Si—C. By deposition of silicon, the layer thickness of the strained silicon is increased.
11. Epitaxial layer, for example Si—Ge, Si—C or Si—Ge—C which is relaxed.
12. Thin epitaxial layer which can be strained or can serve as an etch-stop layer, for example of silicon.
13. Epitaxial layer, for example graded, which is to be relaxed, for example, Si—Ge or Si—C or Si—Ge—C.
14. Shallow trench insulation, a trench etched and filled with insulating material 15.
15. Etched trench with a depth of up to the insulating layer 2 of the SOI substrate 1,2,3.
16. Silicide contact, for example source.
17. Gate dielectric.

18. Gate contact, for example, poly-Si or metal.
19. Gate contact, for example, silicide.
20. Insulation.
21. Silicide drain contact.
22. Raised drain contact (highly doped Si or Si—Ge)

I claim:

1. A method of converting a silicon on insulator (SOI) substrate into a strained SOI substrate, the method comprising the steps of:
    providing an SOI substrate having a thin silicon layer on an insulator substrate;
    providing at least one first strained epitaxial layer on the SOI-substrate,
    producing a defect region in the at least one first strained epitaxial layer by implantation of Si ions above the thin silicon layer of the SOI-substrate, and
    relaxing the at least one first strained epitaxial layer having a defect region by a thermal treatment in an inert atmosphere to cause formation of dislocations in the defect region of the at least one first strained epitaxial layer, which gives rise to relaxation of the at least one strained epitaxial layer which effects a strain in the neighboring thin silicon layer of the SOI-substrate to produce the strained silicon layer directly on the insulator substrate.

2. The method according to claim 1 wherein the Si ions are implanted with a dose of about $0.5 \times 10^{14}$ to $5 \times 10^{14}$ cm$^{-2}$.

3. A method of converting a silicon on insulator (SOI) substrate into a strained SOI substrate, the method comprising the steps of:
    providing an SOI substrate having a thin silicon layer on an insulator substrate;
    providing at least one first strained epitaxial layer on the SOI-substrate,
    producing a defect region in the at least one first strained epitaxial layer by implantation of carbon ions, nitrogen ions, fluorine ions, boron ions, phosphorous ions, arsenic ions, germanium ions, antimony ions, sulfur ions, neon ions, argon ions, krypton ions and/or xenon ions above the thin silicon layer of the SOI-substrate, and
    relaxing the at least one first strained epitaxial layer having a defect region by a thermal treatment in an inert atmosphere to cause formation of dislocations in the defect region of the at least one first strained epitaxial layer, which gives rise to relaxation of the at least one strained epitaxial layer which effects a strain in the neighboring thin silicon layer of the SOI-substrate to produce the strained silicon layer directly on the insulator substrate.

* * * * *